United States Patent
Takahashi et al.

(10) Patent No.: US 8,493,731 B2
(45) Date of Patent: Jul. 23, 2013

(54) FORCED-AIR-COOLED VEHICLE CONTROL DEVICE

(75) Inventors: Tetsuya Takahashi, Tokyo (JP); Hideo Okayama, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 280 days.

(21) Appl. No.: 13/061,645

(22) PCT Filed: Nov. 5, 2008

(86) PCT No.: PCT/JP2008/070085
§ 371 (c)(1),
(2), (4) Date: Mar. 1, 2011

(87) PCT Pub. No.: WO2010/052763
PCT Pub. Date: May 14, 2010

(65) Prior Publication Data
US 2011/0188200 A1    Aug. 4, 2011

(51) Int. Cl.
*H05K 7/20* (2006.01)
*H02M 1/00* (2007.01)

(52) U.S. Cl.
USPC .............................. 361/694; 105/59; 361/695

(58) Field of Classification Search
None
See application file for complete search history.

(56) References Cited

U.S. PATENT DOCUMENTS 6,477,965 B2 * 11/2002 Yamaguchi et al. ............ 105/59
7,688,582 B2 * 3/2010 Fukazu et al. ................. 361/690
2003/0030988 A1 * 2/2003 Garnett et al. ................. 361/724
2008/0062622 A1 * 3/2008 Fukazu et al. ................. 361/678
2008/0257624 A1 * 10/2008 Kubo ........................... 180/68.1

FOREIGN PATENT DOCUMENTS

| EP | 0 794 098 A1 | 9/1997 |
| JP | 60-076461 A | 4/1985 |
| JP | 07-251737 A | 10/1995 |
| JP | 08-238950 A | 9/1996 |
| JP | 11-313485 A | 11/1999 |
| JP | 2003-095089 | 4/2003 |
| JP | 2006-025556 | 1/2006 |
| JP | 2007-049848 A | 2/2007 |
| JP | 2007-082400 | 3/2007 |
| JP | 2007-131128 | 5/2007 |
| JP | 2007-131129 | 5/2007 |

OTHER PUBLICATIONS

Office Action dated Jul. 14, 2009, issued in the corresponding Japanese Patent Application No. 2009-516440, and an English Translation thereof.

(Continued)

*Primary Examiner* — Gregory Thompson
(74) *Attorney, Agent, or Firm* — Buchanan Ingersoll & Rooney PC

(57) ABSTRACT

There is provided a first accommodating chamber that accommodates a cooling unit frame that supports a cooling unit. The cooling unit includes a cooler that cools heat generated from a snubber circuit component and a semiconductor device utilizing cooling air from an air blower, a conductor bar that electrically connects the semiconductor device and a capacitor with each other, the snubber circuit component, and the semiconductor device. There is also provided a second accommodating chamber that accommodates the capacitor. The cooling unit and the capacitor can be separated from each other by detaching one of a connecting portion between a laminated bus bar and the conductor bar and a connecting portion between the laminated bus bar and the capacitor.

3 Claims, 7 Drawing Sheets

OTHER PUBLICATIONS

Supplementary European Search Report dated May 4, 2012, issued in corresponding European Patent Application No. 08877958.2-24221 2343227. (4 pages).

International Search Report (PCT/ISA/210) issued on Jan. 27, 2009, by Japanese Patent Office as the International Searching Authority for International Application No. PCT/JP2008/070085.

Written Opinion (PCT/ISA/237) issued on Jan. 27, 2009, by Japanese Patent Office as the International Searching Authority for International Application No. PCT/JP2008/070085.

Supplementary European Search Report dated Mar. 7, 2012, issued in the corresponding European Patent Application No. 08877958.2. (8 pages).

Office Action from Chinese Patent Office dated Mar. 6, 2013, issued in corresponding Chinese Patent Appln. No. 200880131858.4, with English translation thereof (11 pages).

* cited by examiner

FORCED-AIR-COOLED VEHICLE CONTROL DEVICE

TECHNICAL FIELD

The present invention relates to a forced-air-cooled type vehicle control device (hereinafter, "vehicle control device") used for railroad vehicles.

BACKGROUND ART

Generally, to drive a main drive motor provided in an electric vehicle, when the main drive motor is an induction motor, there is required a vehicle control device including a so-called variable voltage variable frequency (VVVF) inverter that supplies variable voltage variable frequency electric power to the induction motor, a converter used when wiring is an alternating current, and related devices or the like. The vehicle control device is installed using a limited space existing under a floor of a body of the electric vehicle, and many exothermic devices are used in the vehicle control device. Generally, the exothermic devices are forcibly cooled by a cooling unit having a radiator for cooling the exothermic devices, or by an air blower that sends cooling air to the radiator.

When vehicle control devices are classified based on the structure of their cooling units, the vehicle control devices can be roughly divided into a type of vehicle control device in which a cooling unit is detached in a rail surface direction (hereinafter, "bottom surface side of the electric vehicle"), and another type of vehicle control device in which a cooling unit is detached to a side surface direction of an electric vehicle. The cooling unit includes a snubber circuit component, which is a voltage-absorbing circuit component having a resistor, a semiconductor device such as an IGBT, a cooler that cools the lost heat generated by switching of the semiconductor device and the heat generated from the snubber circuit component, an electric wire and a conductor bar that electrically connect a capacitor for smoothing an output of the converter.

When the semiconductor device is operating, if a device applied voltage including a ripple voltage exceeds a device-maximum service voltage, the semiconductor device is broken in some cases. Therefore, to suppress the device applied voltage within a device-maximum service voltage, it is necessary to suppress an impedance value of an inductance between the semiconductor device and a capacitor within a specification value. In this inductance, an inductance of electric parts themselves such as the semiconductor device and the capacitor, and a wiring inductance caused by an electric wire and a conductor bar that electrically connects these parts with each other are included. Particularly, it has been known that when a distance between these parts is shortened, an impedance value of the wiring inductance can be reduced.

For example, a conventional vehicle control device described in Patent Document 1 mentioned below includes a cooling unit having a heat absorber that absorbs the heat of a semiconductor device, a voltage-absorbing circuit component, and a control circuit component, and also having a radiator that radiates the absorbed heat, as well as an air blower that sends cooling air to the radiator. The vehicle control device is accommodated in a casing-like control box (hereinafter, "vehicle control device casing"), and installed below a floor of an electric vehicle.

Patent Document 1: Japanese Patent Application Laid-open No. H07-251737

DISCLOSURE OF INVENTION

Problem to be Solved by the Invention

As described above, when the vehicle control devices are classified based on structures of cooling units, they can be roughly divided into a type of a vehicle control device in which a cooling unit is detached toward a bottom surface side of an electric vehicle, and another type of a vehicle control device in which a cooling unit is detached to a side surface direction of an electric vehicle. In the vehicle control device in which the cooling unit is detached toward the bottom surface side of the electric vehicle, at the time of maintenance of the vehicle control device or replacement of the cooling unit, an operator has to perform such an operation below the vehicle control device, there are problems that the operability is poor and the time required for the maintenance and cooling unit replacement is long.

On the other hand, in the vehicle control device in which the cooling unit is detached to the side surface direction of the electric vehicle, there is an advantage such that the time required for maintenance and replacement of the cooling unit is short as compared with a case that an operation is performed on the bottom surface side of the electric vehicle. However, to sufficiently secure the size of an opening that is formed on the side surface of the vehicle control device casing and through which the cooling unit is detached, or to prevent a structure on the side of the vehicle body that is a wiring duct existing in the side surface direction of the electric vehicle from hindering detaching of the cooling unit, it is necessary to reduce the cooling unit in its outer size, particularly, in its height size.

Meanwhile, in the case of the conventional vehicle control device as described in Patent Document 1 mentioned above, because the semiconductor device, the snubber circuit component, the cooler, the capacitor, the electric wire, and the conductor bar are integrally formed, the cooling unit cannot be reduced in size and weight, and there is a problem that maintainability and handleability are poor. Particularly, the capacitor is heavy and occupies about 30% of the entire mass of the cooling unit, and thus the capacitor is a large factor of hindering the reduction of the cooling unit in size and weight.

The present invention has been achieved in view of the above problems, and an object of the present invention is to provide a forced-air-cooled type vehicle control device that can reduce size and weight of a cooling unit thereof, and enhances maintainability and handleability.

Means for Solving Problem

In order to solve above-mentioned problems and achieve the object, according to an aspect of the present invention, a forced-air-cooled type vehicle control device having an air blower that sends cooling air to an exothermic part and is installed under a vehicular floor of an electric vehicle, wherein the forced-air-cooled type vehicle control device comprising: a control circuit component including a contactor; a snubber circuit component that is a voltage-absorbing circuit component; a capacitor that is electrically connected to a converter and an inverter and smoothes an output of the converter; a semiconductor device provided in the converter and the inverter; a cooler that cools heat generated by the semiconductor device and the snubber circuit component utilizing cooling air from the air blower; a conductor bar that electrically connects the semiconductor device to the capacitor; and a bus bar that electrically connects the conductor bar and the capacitor, the forced-air-cooled type vehicle control device further comprising: a first accommodating chamber that accommodates a first support body that supports a cooling unit such that the first support body can move in a side surface direction of an electric vehicle; and a second accommodating chamber that is arranged below the first accommodating chamber and accommodates the second support body supporting the capacitor such that the second support body can move in the side surface direction of the electric vehicle, the cooling unit including the semiconductor device, the snubber circuit component, the cooler, and the conductor bar, wherein the bus bar is formed into a flat-plate like shape, and the conductor bar and the capacitor are connected to a same surface of the bus bar through screws inserted through screw holes formed in the bus bar, and the conductor bar and the capacitor can be separated from each other by detaching one of a connecting portion between the bus bar and the conductor bar and a connecting portion between the bus bar and the capacitor.

Effect of the Invention

The vehicle control device according to the present invention includes the first accommodating chamber that accommodates the first support body that supports the cooling unit, and the second accommodating chamber that accommodates the capacitor. The cooling unit and the capacitor can be separated from each other by detaching one of the connecting portion between the conductor bar and the bus bar that electrically connects the capacitor and the connecting portion between the bus bar and the capacitor. Therefore, the cooling unit can be reduced in size and weight, and maintainability and handleability can be enhanced.

EXPLANATIONS OF LETTERS OR NUMERALS

Figure 1:
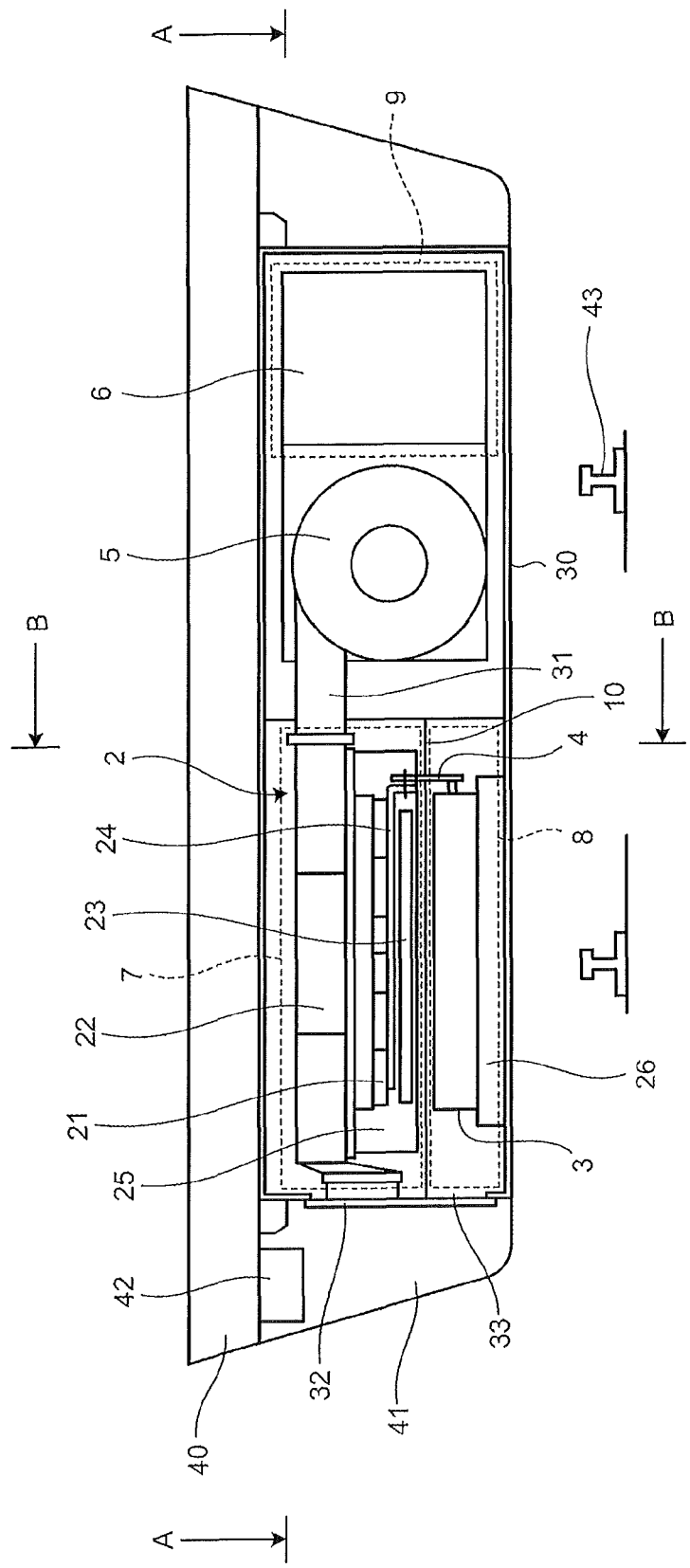
FIG. 1 is a vertical sectional view of a vehicle control device according to a first embodiment.

2 Cooling unit
3 Capacitor
4 Laminated bus bar
5 Air blower
6 Control circuit component
7 First accommodating chamber
8 Second accommodating chamber
9 Third accommodating chamber
10 Partition plate
21 Semiconductor device
22 Cooler
23 Snubber circuit component
24 Conductor bar
25 Cooling unit frame (first support body)
26 Capacitor unit frame (second support body)
30 Vehicle control device casing
31 Air tunnel
32 Casing cover
33 Opening
40 Vehicle body
41 Vehicle body skirt
42 Vehicle-body side structure
43 Rail

BEST MODE(S) FOR CARRYING OUT THE INVENTION

Exemplary embodiments of a forced-air-cooled type vehicle control device according to the present invention will be explained below in detail with reference to the accompanying drawings. The present invention is not limited to the embodiments.

Figure 2:
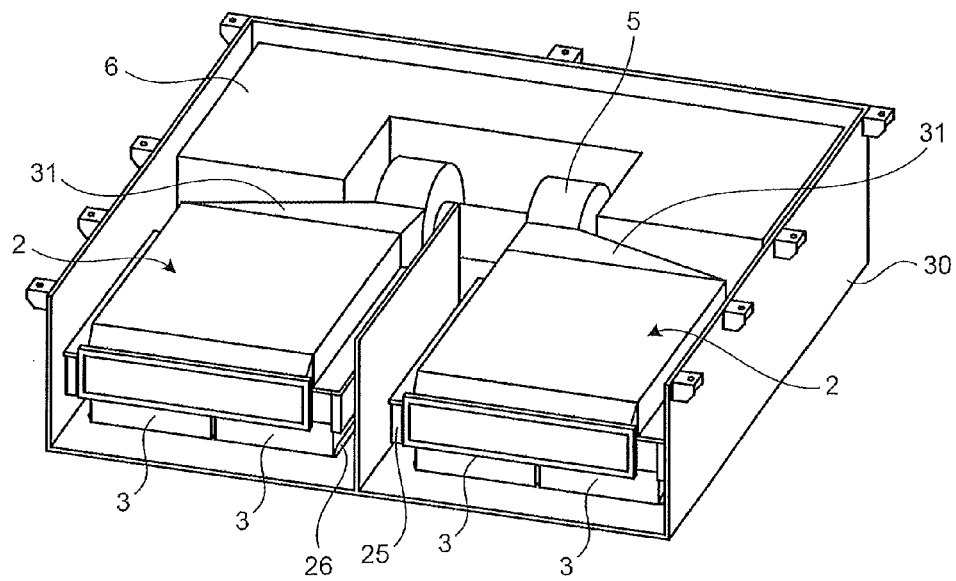
FIG. 2 is a perspective view taken along a line A-A in FIG. 1.
Figure 3:
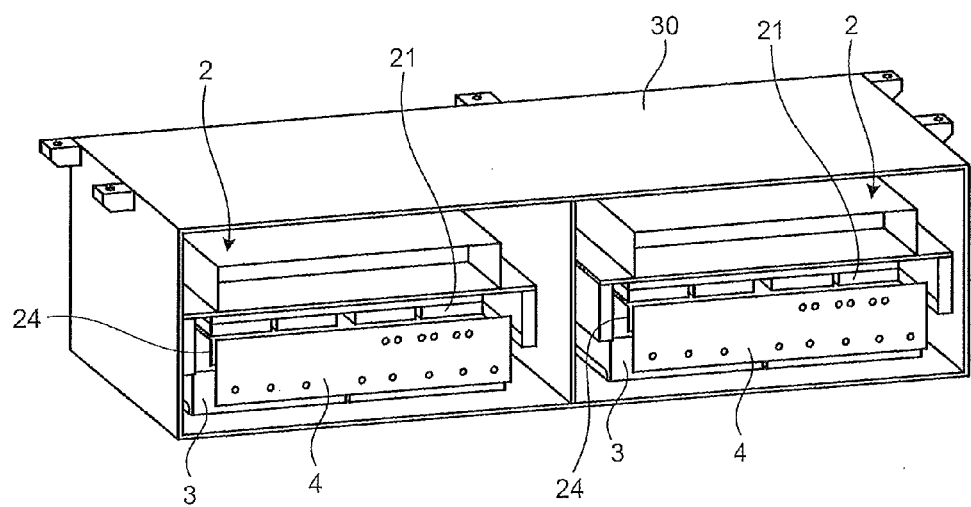
FIG. 3 is a perspective view taken along a line B-B in FIG. 1.

First Embodiment
(Configuration of Vehicle Control Device)
FIG. 1 is a vertical sectional view of a vehicle control device according to a first embodiment, FIG. 2 is a perspective view taken along a line A-A in FIG. 1, and FIG. 3 is a perspective view taken along a line B-B in FIG. 1. As main constituent units, the vehicle control device according to the first embodiment includes first accommodating chambers 7, second accommodating chambers 8, third accommodating chambers 9, and air blowers 5. The first accommodating chambers 7, the second accommodating chambers 8, the third accommodating chambers 9, and the air blowers 5 are accommodated in a vehicle control device casing 30, and they are provided between a lower portion of a vehicle body 40 and rails 43. An opening 33 used when cooling units 2 are detached and a casing cover 32 that closes the opening 33 are respectively formed in and on a left side surface of the vehicle control device casing 30. A vehicle-body side structure 42 that is a wiring duct is shown outside of a left side of the vehicle control device casing 30. A vehicle body skirt 41 that extends in an underfloor direction of the vehicle body and covers the vehicle control device casing 30 is shown outside of the vehicle control device casing 30.

(First Accommodating Chamber)
Each of the first accommodating chambers 7 accommodates the cooling unit 2 and a cooling unit frame 25 that is a first support body.

Each of the cooling units 2 includes a cooler 22. The cooler 22 cools the heat generated from a snubber circuit component 23 that is a voltage-absorbing circuit component including a resistor and the heat generated by switching of a semiconductor device 21 such as an IGBT utilizing cooling air from the air blower 5. The cooling unit 2 further includes a conductor bar 24 that electrically connects the semiconductor device 21 with capacitors 3, the snubber circuit component 23, and the semiconductor device 21.

The cooling unit frame 25 supports the cooling unit 2, and is installed on a partition plate 10 that partitions the first accommodating chamber 7 and the second accommodating chamber 8 such that the cooling unit frame 25 can move in a side surface direction of the electric vehicle. That is, the first accommodating chamber 7 accommodates the cooling unit frame 25 that supports the cooling unit 2 such that the cooling unit frame 25 can move in the side surface direction of the electric vehicle.

(Second Accommodating Chamber)

Each of the second accommodating chambers 8 accommodates the capacitors 3 arranged below the first accommodating chamber 7 through the partition plate 10, and a capacitor unit frame 26.

The capacitor unit frame 26 supports the capacitor 3, and is installed on a bottom surface of the vehicle control device casing 30 such that the capacitor unit frame 26 can move in the side surface direction of the electric vehicle. That is, the second accommodating chamber 8 accommodates the capacitor unit frame 26 that supports the capacitors 3 such that the capacitor unit frame 26 can move in the side surface direction of the electric vehicle.

In this manner, the cooling unit 2 and the capacitors 3 are accommodated such that the cooling unit 2 and the capacitors 3 are separated from each other in a vertical direction by the partition plate 10 provided between the first accommodating chamber 7 and the second accommodating chamber 8.

(Laminated Bus Bar)

The conductor bar 24 accommodated in the first accommodating chamber 7 and the capacitors 3 accommodated in the second accommodating chamber 8 are electrically connected with each other using a parallel copper plate such as a laminated bus bar 4 to reduce the impedance of the wiring inductance. The conductor bar 24 and the capacitors 3 can be separated from each other, and the cooling unit frame 25 or the capacitor unit frame 26 can be detached in the side surface direction of the electric vehicle by detaching one of a connecting portion between the laminated bus bar 4 and the conductor bar 24 and a connecting portion between the laminated bus bar 4 and the capacitors 3.

Each of the air blowers 5 is installed between the first accommodating chamber 7, the second accommodating chamber 8, and the third accommodating chamber 9. The air blower 5 sends cooling air to the cooler 22 incorporated in the cooling unit 2. The cooling air is sent from the air blower 5 and passes through an air tunnel 31, the cooler 22, and the casing cover 32 in this order, and is discharged outside on the left side of the vehicle control device. It is possible to employ such a configuration that the cooling air passes through the casing cover 32, the cooler 22, the air tunnel 31, and the air blower 5 in this order, and is discharged out on the lower side of the vehicle control device.

(Third Accommodating Chamber)

The third accommodating chamber 9 accommodates control circuit components 6 such as a printed board, a relay, and a contactor. The control circuit components 6 can be installed on the bottom surface of the vehicle control device casing 30 such that the control circuit components 6 can move in a right side surface direction of the electric vehicle using a unit frame.

As an example, FIG. 2 depicts the vehicle control device casing 30 having the VVVF-inverter cooling unit 2, the converter cooling unit 2, and the capacitors 3. The partition plate 10 is provided between the cooling unit frame 25 and the capacitors 3 as described above, the cooling unit frame 25 is mounted on the partition plate 10, and the capacitor unit frame 26 is provided below the partition plate 10. In the above explanations, the cooling unit frame 25 is mounted above the partition plate 10 and the capacitor unit frame 26 is arranged below the partition plate 10; however, the present invention is not limited thereto, and it is also possible to employ such a configuration that the capacitor unit frame 26 is mounted above the partition plate 10 and the cooling unit frame 25 is arranged below the partition plate 10. In FIG. 2, while two capacitors 3 are provided for each of the cooling units 2, the present invention is not limited thereto.

Each of the laminated bus bars 4 shown in FIG. 3 is joined to an end of the conductor bar 24 and connection terminals of the capacitors 3 through a plurality of screws, and the laminated bus bar 4 electrically connects the conductor bar 24 and the capacitors 3 with each other. Electric connection between the conductor bar 24 and the capacitors 3 is disconnected by detaching one of the screws of the end of the conductor bar 24 and the connection terminals of the capacitors 3, and the cooling unit frame 25 and the capacitor unit frame 26 can be pulled out in the side surface direction of the vehicle control device. A detaching procedure of the cooling unit frame 25 and the capacitor unit frame 26 from the vehicle control device is described below.

(Detaching Procedure of Cooling Unit)

Figure 4:
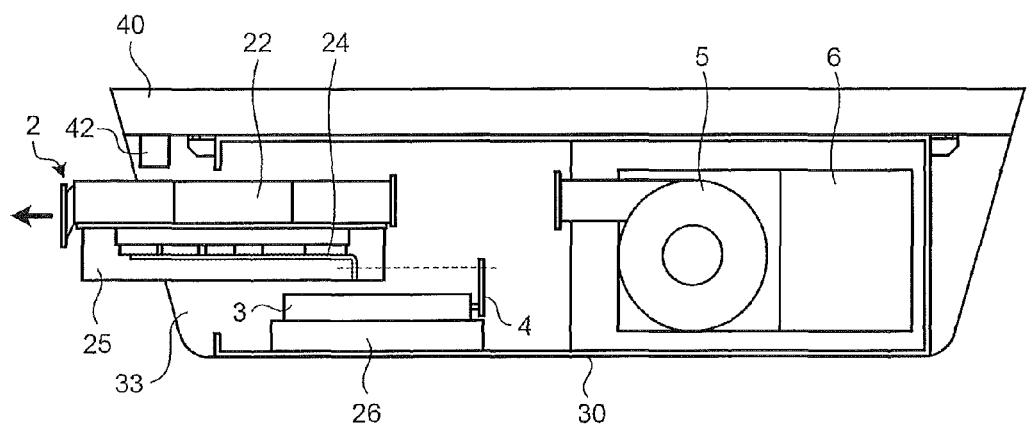
FIG. 4 is a vertical sectional view during detaching of a cooling unit from the vehicle control device.
Figure 5:
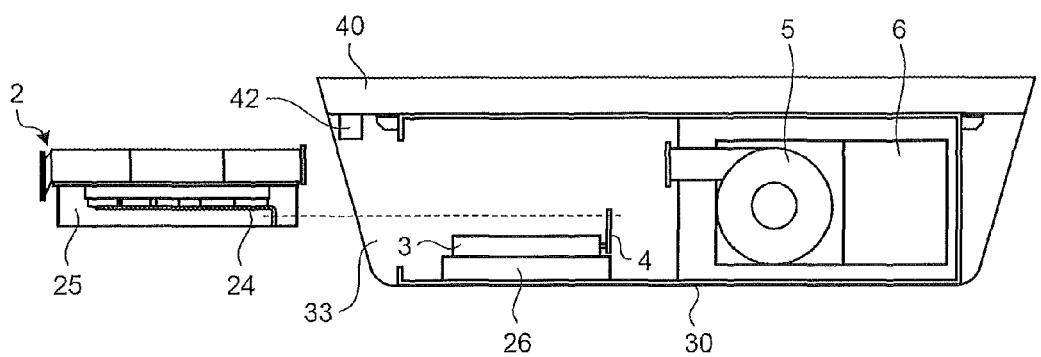
FIG. 5 is a vertical sectional view after a cooling unit is detached from the vehicle control device.
Figure 6:
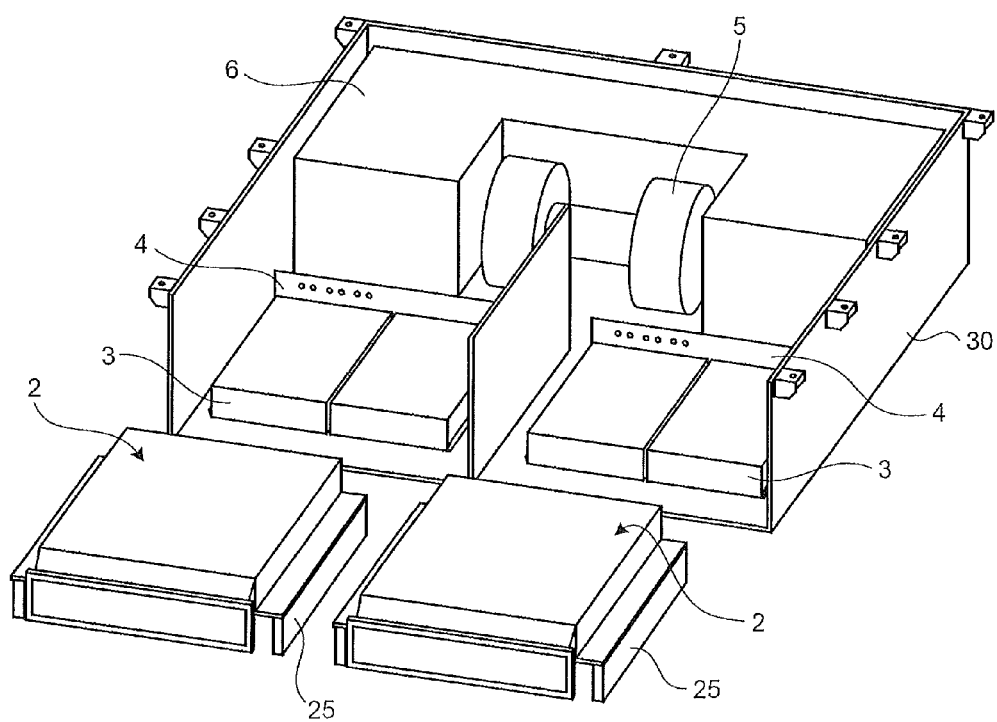
FIG. 6 is a perspective view after a cooling unit is detached from the vehicle control device.

The detaching procedure of the cooling unit 2 is described with reference to FIGS. 1 to 6. FIG. 4 is a vertical sectional view during detaching of the cooling unit from the vehicle control device. FIG. 5 is a vertical sectional view after the cooling unit is detached from the vehicle control device. FIG. 6 is a perspective view after the cooling unit is detached from the vehicle control device. First, the casing cover 32 is detached and all of the screws threadedly inserted into the conductor bar 24 are detached from screw holes formed in upper portions of the laminated bus bar 4 (see FIG. 4). Next, various wires and mounting bolts of the cooling units 2 are detached, and the cooling unit frame 25 is pulled out from the opening 33 of the vehicle control device casing 30 with careful attention not to touch the vehicle-body side structure 42. As a result, each of the cooling unit frames 25 can be detached in the side surface direction of the electric vehicle (see FIGS. 5 and 6). When the cooling unit frame 25 is attached to the vehicle control device casing 30, it suffices that the procedure described above is performed in a reversed manner.

(Detaching Procedure of Capacitor)

Figure 7:
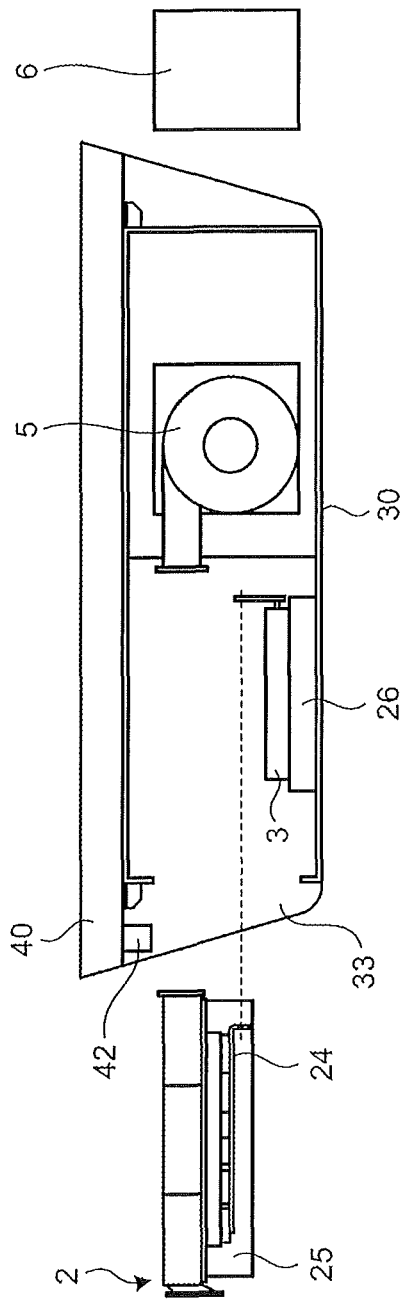
FIG. 7 depicts a state that a cooling unit is detached to detach a capacitor from the vehicle control device.
Figure 8:
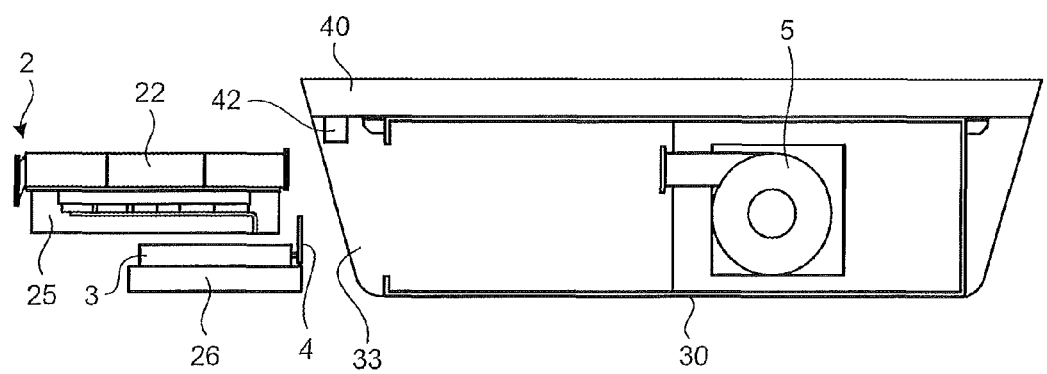
FIG. 8 is a vertical sectional view of a state that a capacitor is detached after a cooling unit is detached from the vehicle control device.

FIGS. 7 and 8 are vertical sectional views of a procedure when the capacitor is detached from the vehicle control device. More specifically, FIG. 7 depicts a state that the cooling unit is detached to detach the capacitor from the vehicle control device, and FIG. 8 is a vertical sectional view of a state that the capacitor is detached after the cooling unit is detached from the vehicle control device. FIG. 7 also depicts a state that the control circuit component 6 is detached from the third accommodating chamber 9.

The casing cover 32 is detached, all of screws threadedly inserted into the conductor bar 24 are detached from screw holes formed in the upper portions of the laminated bus bar 4, the various wires and the mounting bolt of the cooling unit frame 25 are detached, and the cooling unit frame 25 is pulled out from the opening 33 of the vehicle control device casing 30 with careful attention not to touch the vehicle-body side structure 42 (see FIG. 7). Next, the capacitor unit frame 26 is pulled out from the opening 33 of the vehicle control device casing 30 while paying attention to a projection of a left lower end of the vehicle control device casing 30 and as a result, not only the cooling unit frame 25, but also the capacitor unit frame 26 can be detached (see FIG. 8). When the capacitor unit frame 26 is attached to the vehicle control device casing 30, it suffices that the procedure described above is performed in a reversed manner.

FIG. 7 depicts a state that only the control circuit components 6 are detached from the third accommodating chamber 9. That is, according to the configuration shown in FIG. 7, the control circuit components 6 are installed directly on the vehicle control device casing 30; however, the present invention is not limited thereto. For example, the control circuit components 6 mounted on the unit frame corresponding to the cooling unit frame 25 or the capacitor unit frame 26 can be pulled out from a right opening of the vehicle control device casing 30 together with this unit frame.

Figure 9:
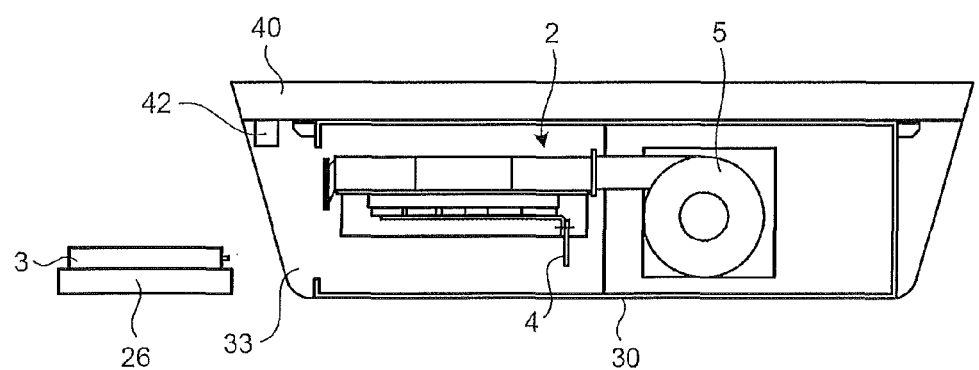
FIG. 9 is a vertical sectional view of a state that only a capacitor is detached from the vehicle control device.

FIG. 9 is a vertical sectional view of a state that only the capacitor is detached from the vehicle control device. In FIGS. 7 and 8, the capacitor 3 is detached after the cooling unit 2 is pulled out in the side surface direction of the electric vehicle. However, when all of screws threadedly inserted into the capacitor 3 are detached from screw holes formed in lower portions of the laminated bus bar 4, the capacitor unit frame 26 can be detached in a state that the cooling unit frame 25 and the laminated bus bar 4 are left in the vehicle control device casing 30.

As described above, the vehicle control device according to the first embodiment includes the cooling units 2, the first accommodating chambers 7 accommodating cooling unit frames 25 that support the cooling units 2, and the second accommodating chambers 8 accommodating the capacitors 3 and the capacitor unit frames 26 that support the capacitors 3, each of the cooling unit 2 and each of the capacitors 3 can be separated from each other by detaching one of the connecting portion between the conductor bar 24 and the laminated bus bar 4 that electrically connects the capacitor 3 and the connecting portion between the laminated bus bar 4 and the capacitor 3. Therefore, it is possible to suppress the impedance of the wiring inductance to a low value, a handling unit of each of the cooling unit 2 and the capacitor 3 can be reduced in size and weight, and it is possible to effectively utilize the interior space of the vehicle control device. As a result, according to the vehicle control device of the first embodiment, it is possible to enhance the maintainability and handleability of the cooling unit 2 as compared with the conventional technique, and because the entire vehicle control device can be reduced in size and weight, the energy of the electric vehicle can be also saved. It becomes easy to separate, pack, transport, and crush the cooling unit 2 and the capacitor 3.

Further, according to the vehicle control device of the first embodiment, because the cooling unit frame 25 and the capacitor unit frame 26 are separated from each other, the cooling unit frame 25 is reduced in size or weight by removing a member that supports the heavy capacitor 3 from the member constituting the cooling unit frame 25, and the maintainability and handleability of the cooling unit 2 can be further enhanced. In the first embodiment, while the vehicle control device has the two capacitors 3, even when the vehicle control device has one capacitor or three or more capacitors, identical effects can be obtained.

Second Embodiment

According to the vehicle control device of the first embodiment, the capacitor unit frame 26 supports the capacitors 3, and the capacitor unit frame 26 is installed on the bottom surface of the vehicle control device casing 30 such that the capacitor unit frame 26 can move in the side surface direction of the electric vehicle. However, because a maintenance cycle of the capacitor 3 is long as compared with that of the cooling unit 2, the capacitors 3 can be set directly on the vehicle control device casing 30 without using the capacitor unit frame 26 that is used for enhancing the maintainability and handleability.

Figure 10:
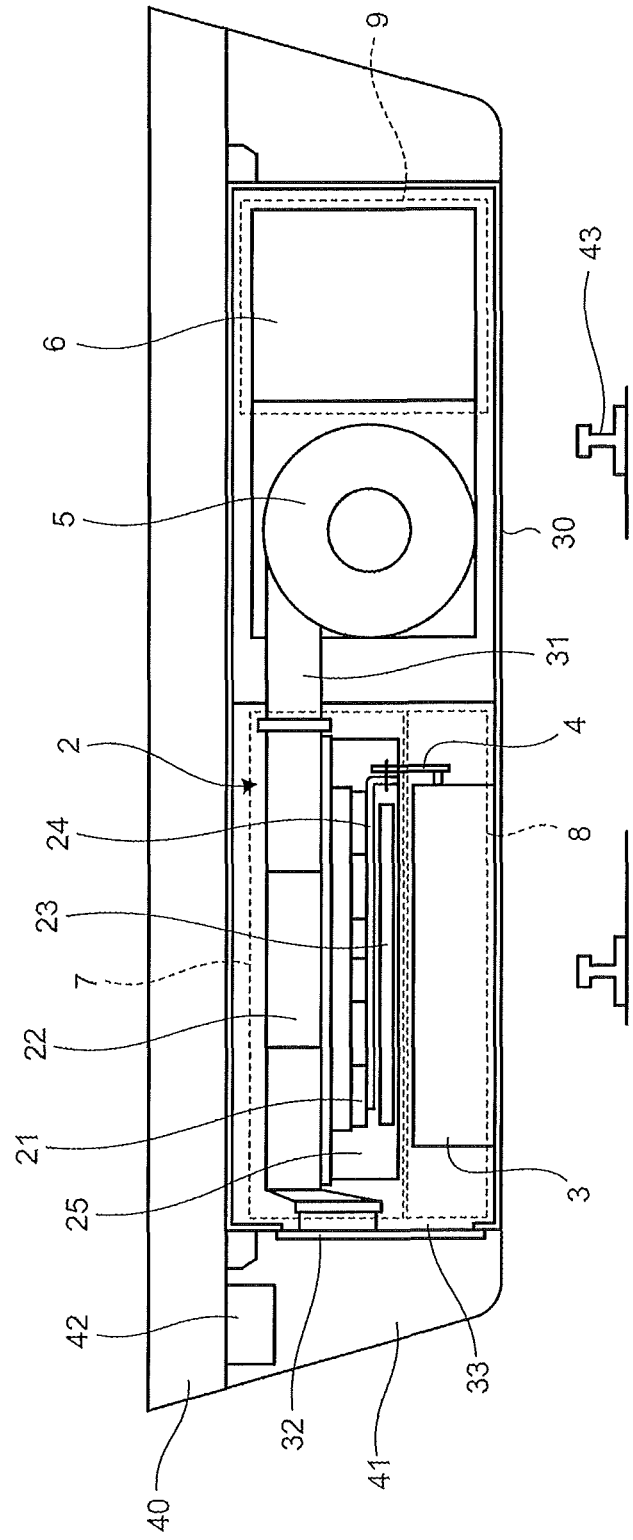
FIG. 10 is a vertical sectional view of a vehicle control device in which capacitors are set in a vehicle control device casing.

FIG. 10 is a vertical sectional view of a vehicle control device in which capacitors are set in a vehicle control device casing. A configuration of the vehicle control device according to a second embodiment is the same as that of the first embodiment except that the capacitor unit frame 26 is removed, and the maintenance of the cooling units 2 can be performed according to the detaching procedure of the cooling units 2 described in the first embodiment. In the vehicle control device according to the second embodiment, because the capacitor unit frame 26 is removed, the vehicle control device can be further reduced in size and weight as compared with the vehicle control device according to the first embodiment.

The configuration of the vehicle control device described in the first and second embodiments is only an example of the contents of the present invention. The above embodiments can be combined with other well-known techniques, and it is needless to mention that these embodiments can be modified without departing from the scope of the present invention, such as omitting a part of the configuration.

INDUSTRIAL APPLICABILITY

As described above, the forced-air-cooled type vehicle control device according to the present invention is particularly useful for a vehicle control device that cools a semiconductor device or the like by a forced-air-cooled system.

The invention claimed is:

1. A forced-air-cooled type vehicle control device having an air blower that sends cooling air to an exothermic part and is installed under a vehicular floor of an electric vehicle, wherein the forced-air-cooled type vehicle control device comprising: a control circuit component including a contactor; a snubber circuit component that is a voltage-absorbing circuit component; a capacitor that is electrically connected to a converter and an inverter and smoothes an output of the converter; a semiconductor device provided in the converter and the inverter; a cooler that cools heat generated by the semiconductor device and the snubber circuit component utilizing cooling air from the air blower; a conductor bar that electrically connects the semiconductor device to the capacitor; and a bus bar that electrically connects the conductor bar and the capacitor, the forced-air-cooled type vehicle control device further comprising: a first accommodating chamber that accommodates a first support body that supports a cooling unit of the cooler such that the first support body can move in a side surface direction of an electric vehicle; and a second accommodating chamber that is arranged below the first accommodating chamber and accommodates a second support body supporting the capacitor such that the second support body can move in the side surface direction of the electric vehicle, the cooling unit including the semiconductor device, the snubber circuit component, the cooler, and the conductor bar, wherein the bus bar is formed into a flat-plate shape, and the conductor bar and the capacitor are connected to a same surface of the bus bar through screws inserted through screw holes formed in the bus bar, and the conductor bar and the capacitor can be separated from each other by detaching one of a connecting portion between the bus bar and the conductor bar and a connecting portion between the bus bar and the capacitor.

2. The forced-air-cooled type vehicle control device according to claim 1, further comprising a third accommodating chamber that accommodates the control circuit component.

3. The forced-air-cooled type vehicle control device according to claim 2, wherein the air blower is provided between the first accommodating chamber, the second accommodating chamber, and the third accommodating chamber.

* * * * *